US008877658B2

(12) United States Patent
Yoshimoto

(10) Patent No.: US 8,877,658 B2
(45) Date of Patent: Nov. 4, 2014

(54) DIRECTED SELF-ASSEMBLY OF BLOCK COPOLYMERS USING LASER ANNEALING

(71) Applicant: GLOBALFOUNDRIES Inc., Grand Cayman, KY (US)

(72) Inventor: Kenji Yoshimoto, Honmachi (JP)

(73) Assignee: GLOBALFOUNDRIES Inc., Grand Cayman (KY)

( * ) Notice: Subject to any disclaimer, the term of this patent is extended or adjusted under 35 U.S.C. 154(b) by 73 days.

(21) Appl. No.: 13/653,606

(22) Filed: Oct. 17, 2012

(65) Prior Publication Data

US 2014/0106575 A1 Apr. 17, 2014

(51) Int. Cl.
*H01L 21/31* (2006.01)
*H01L 21/02* (2006.01)

(52) U.S. Cl.
CPC .................. *H01L 21/02354* (2013.01)
USPC ............. 438/781; 438/57; 257/E21.347

(58) Field of Classification Search
USPC ............ 257/E21.317, E21.471, E21.475
See application file for complete search history.

(56) References Cited

U.S. PATENT DOCUMENTS

2008/0217292 A1* 9/2008 Millward et al. ............... 216/46

* cited by examiner

*Primary Examiner* — Cheung Lee
(74) *Attorney, Agent, or Firm* — Darrell L. Pogue; Keohane & D'Alessandro, PLLC

(57) ABSTRACT

Methods for performing directed self-assembly (DSA) of block copolymer (BCP) material on a substrate are disclosed. The BCP is disposed over a patterned neutral layer made from a random copolymer. The BCP is annealed with a laser to induce the directed self-assembly. The scan type may include single scan, multiple scan, or multiple scan with overlap. A variety of power settings and dwell times may be used within a single wafer to achieve multiple heating conditions within a single wafer.

14 Claims, 6 Drawing Sheets

DIRECTED SELF-ASSEMBLY OF BLOCK COPOLYMERS USING LASER ANNEALING

FIELD OF THE INVENTION

The present invention relates generally to nanostructures and, more particularly, to directed self-assembly of block copolymers using laser annealing.

BACKGROUND

A semiconductor device typically includes a network of circuits that are formed over a substrate. The device may include several layers of circuit wiring, with various interconnects being used to connect these layers to each other and any underlying transistors. The fabrication of semiconductor devices may utilize a series of lithographic and etching steps to define the positions and dimensions of various features.

As the trend towards miniaturization continues, semiconductors are being produced with smaller critical dimensions (CDs) and tighter pitches. As the critical dimension miniaturizes below the 22 nm node, new challenges are pushing conventional lithography to its limits.

Block copolymer (BCP) patterning has attracted attention as a possible solution to the problem of creating patterns with smaller dimensions. Under the right conditions, the blocks of such copolymers phase separate into microdomains (also known as "microphase-separated domains" or "domains") to reduce the total free energy, and in the process, nanoscale features of dissimilar chemical compositions are formed. The ability of block copolymers to form such features recommends their use in nanopatterning, and to the extent that features with smaller CDs can be formed, this should enable the construction of features which would otherwise be difficult to print using conventional lithography. However, without any guidance from the substrate, the microdomains in a self-assembled block copolymer thin film are typically not spatially registered or aligned.

To address the problem of spatial registration and alignment, directed self-assembly (DSA) has been used. This is a method that combines aspects of self-assembly with a lithographically defined substrate to control the spatial arrangement of certain self-assembled BCP domains. It is therefore desirable to have improvements in directed self-assembly of block copolymers.

SUMMARY

In general, embodiments of the present invention provide approaches for performing directed self-assembly (DSA) of block copolymer (BCP) material on a substrate. The BCP is disposed over a patterned neutral layer, which may be made from a random copolymer. The BCP is annealed with a laser to induce the directed self-assembly. The scan type may include single scan, multiple scan (non-overlapping), or multiple scan with overlap. A variety of intensity (power) settings, wavelengths, beam sizes, and dwell times may be used within a single wafer to achieve multiple heating conditions.

A first aspect of the present invention provides a method for annealing a block copolymer, comprising: forming a block copolymer layer on a patterned substrate, and directing radiation at the patterned substrate such that self-assembly of the block copolymer is induced.

A second aspect of the present invention provides a method for annealing a block copolymer, comprising: forming a patterned substrate on an antireflective coating layer; forming a block copolymer layer on a patterned substrate; and directing radiation at the patterned substrate such that self-assembly of the block copolymer is induced.

A third aspect of the present invention provides a method for annealing a block copolymer, comprising: forming a patterned substrate on an antireflective coating layer, wherein forming a block copolymer layer on a patterned substrate further comprises: forming a patterned substrate comprising multiple regions of PS-r-PMMA having a thickness ranging from about 4 nanometers to about 5 nanometers; forming a block copolymer layer having a thickness of about 30 nanometers on the patterned substrate; and directing radiation from a diode laser to the block copolymer such that self-assembly of the block copolymer is induced, wherein the radiation has a wavelength of 980 nanometers, and wherein the diode laser has an intensity setting ranging from 85 W/mm2 to 95 W/mm2, and wherein the diode laser is applied using a scan type of multiple scan with 36 scans per region.

BRIEF DESCRIPTION OF THE DRAWINGS

These and other features of this invention will be more readily understood from the following detailed description of the various aspects of the invention taken in conjunction with the accompanying drawings.

DETAILED DESCRIPTION

Exemplary embodiments will now be described more fully herein with reference to the accompanying drawings, in which exemplary embodiments are shown. Exemplary embodiments of the invention provide approaches for performing directed self-assembly (DSA) of block copolymer (BCP) material on a substrate. The BCP is disposed over a patterned neutral layer which may be made from a random copolymer. The BCP is annealed with a laser to induce the directed self-assembly. The scan type may include single scan, multiple scan (non-overlapping), or multiple scan with overlap. A variety of intensity (power) settings and dwell times may be used within a single wafer to achieve multiple heating conditions within a single wafer.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g. a second layer), wherein intervening elements, such as an interface structure (e.g. interface layer), may be present between the first element and the second element.

Figure 1:
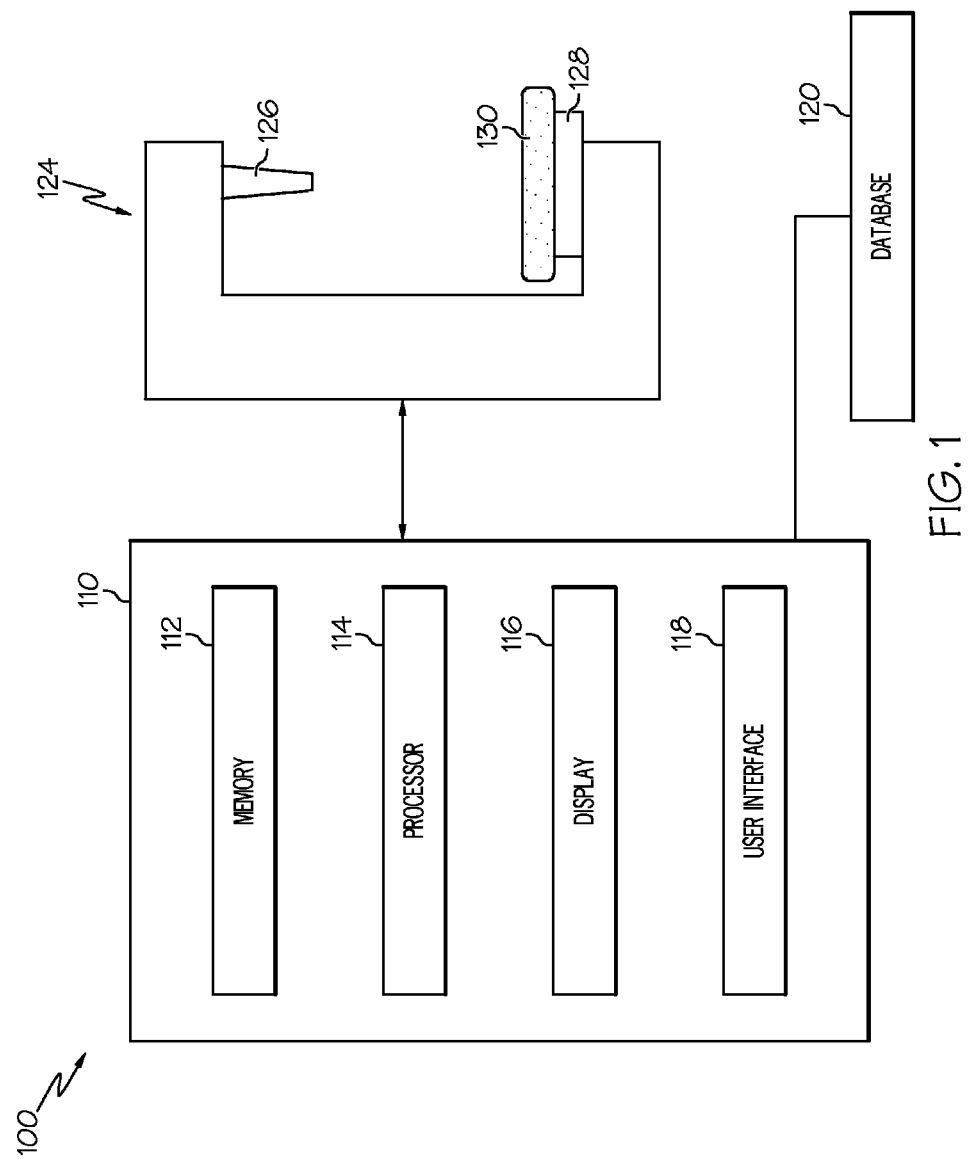
FIG. 1 shows a system for carrying out a method in accordance with illustrative embodiments of the present invention.

FIG. 1 shows a system 100 for carrying out a method in accordance with illustrative embodiments of the present invention. A main controller 110 is configured and disposed to control a laser annealing tool 124. The main controller 110 may be a computer comprising memory 112 and a processor 114 which is configured to read and write memory 112. The memory 112 may be non-transitory memory, such as flash, ROM, non-volatile static ram, or the like. The memory 112 contains instructions that, when executed by processor 114, control the operation of laser annealing tool 124. Main controller 110 may also comprise a display 116 and a user interface 118 for interacting with the main controller 110. The user interface 118 may comprise a keyboard, touch screen, mouse, or the like.

The main controller 110 may access a database 120, which stores various tunable parameter values to be used during the annealing process. The tunable parameters may include, but are not limited to, dwell time, power settings, scan type, and beam size parameters.

Laser annealing tool 124 comprises a laser 126. In some embodiments, laser 126 is a diode laser. In other embodiments, laser 126 is a $CO_2$ laser. In some embodiments, laser 126 is a pulsed laser. In other embodiments, laser 126 is a continuous wave laser.

A workpiece 130, such as a wafer, is disposed on a chuck 128. During operation, laser 126 radiates workpiece 130 to perform an annealing operation on it. A laser beam from laser 126 may be moved relative to the workpiece to scan the workpiece. Alternatively, the workpiece 130 may be moved relative to a stationary laser 126.

Figure 2:
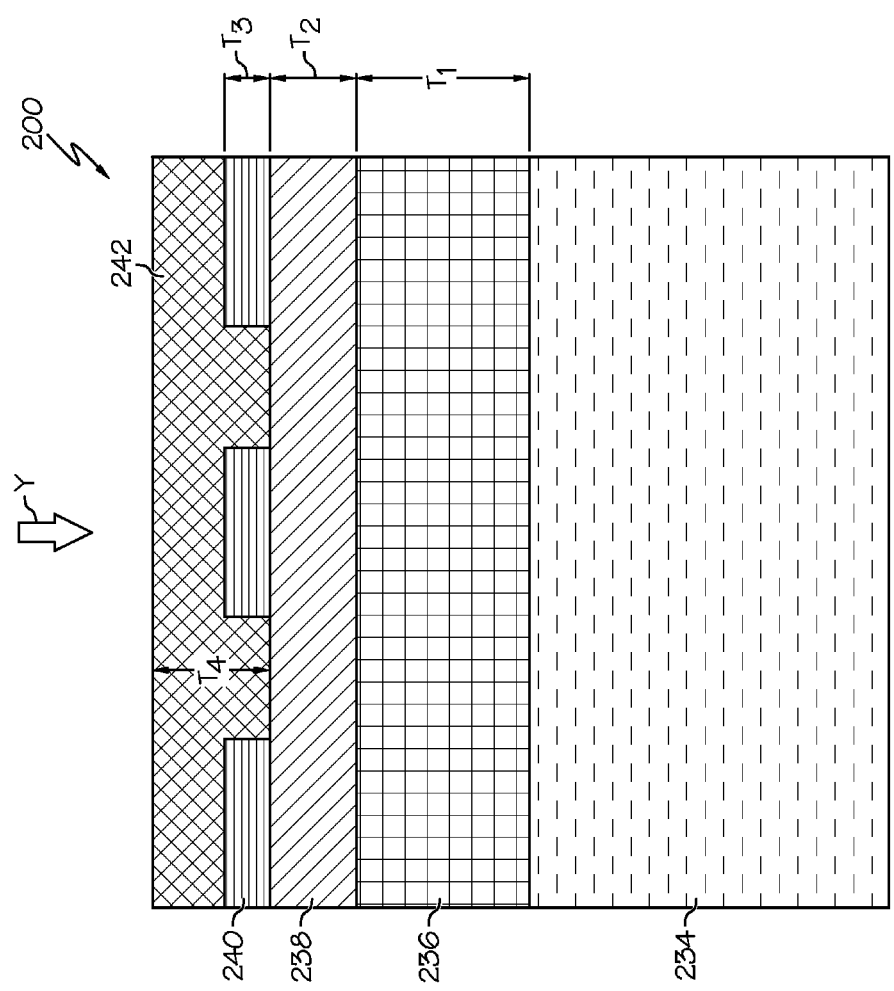
FIG. 2 shows a nanostructure used with methods in accordance with illustrative embodiments of the present invention.

FIG. 2 shows a nanostructure 200 used with methods in accordance with illustrative embodiments of the present invention. A bulk semiconductor substrate 234 forms the base of nanostructure 200. In some embodiments, bulk semiconductor substrate 234 is a silicon substrate, and may be in the form of a wafer. In some embodiments, the wafer is a 300 millimeter wafer.

Disposed on bulk semiconductor substrate 234 is an organic planarization layer (OPL) 236. Examples of suitable materials for the organic planarization layer include JSR NFC series, HM series, or ShinEtsu ODL series. In one embodiment, OPL 236 is ODL-401, commercially available from ShinEtsu Chemical, Co., Ltd. In some embodiments, OPL 236 has a thickness T1 ranging from about 20 nanometers to about 100 nanometers. In some embodiments, the OPL 236 has a thickness T1 ranging from about 45 nanometers to about 65 nanometers. The OPL 236 serves to create a more level surface patterning. It may also have some optically absorbing components, and thus may also behave like an antireflective coating.

Disposed on OPL 236 is an antireflective coating layer 238. In some embodiments, antireflective coating layer 238 is a silicon-based antireflective coating (SiARC). In some embodiments, a SiARC layer 238 having a thickness T2 ranging from about 10 nanometers to about 40 nanometers is used. In some embodiments, a SiARC layer 238 having a thickness T2 ranging from about 15 nanometers to about 25 nanometers is used.

Disposed on antireflective coating layer 238 is a patterned neutral layer (PNL) 240, which serves as a chemical guide pattern. In some embodiments, the PNL 240 is a patterned substrate made from a random copolymer material. In some embodiments, the PNL 240 has a thickness T3 ranging from about 2 nanometers to about 15 nanometers. In some embodiments, the PNL 240 has a thickness T3 ranging from about 3 nanometers to about 8 nanometers.

Disposed on PNL 240 is block copolymer (BCP) layer 242. In some embodiments, the BCP layer 242 has a thickness T4 ranging from about 15 nanometers to about 45 nanometers. In some embodiments, the BCP layer 242 has a thickness T4 ranging from about 20 nanometers to about 35 nanometers. In some embodiments, the PNL is made from polystyrene-r-poly (methyl methacrylate) (PS-r-PMMA) with between 45% PMMA and 55% PMMA. In some embodiments, the BCP layer is made from a polystyrene-co-poly(methyl methacrylate) (PS-co-PMMA) material.

The block copolymer is a long chain molecule composed of "blocks" of at least two different components, and may have a form such as AAAAAAAAAAAAABBBBBBBBBBBBBB, where "A" represents a first component and "B" represents a second component. In some embodiments, the BCP 242 may include more than two components. For example, the BCP 242 may have a form such as AAAAAABBBBBBBBBBBBBBCCCCCC, where "C" represents a third component.

As a result of directed self-assembly, the blocks arrange to form useful features, such as lines, cylinders, or other structures. The PNL 240 serves as a surface treatment that creates a neutral surface for the BCP 242. In some embodiments, the PNL is made from a random copolymer, and its chains may have a form such as ABAAABBABABBABABAABABAB-BAAABA. When the temperature of the BCP layer 242 is raised due to radiation directed (applied) from the laser (126 of FIG. 1) in the direction indicated by arrow Y, the BCP undergoes directed self-assembly (DSA) to form the desired structure.

Figure 3:
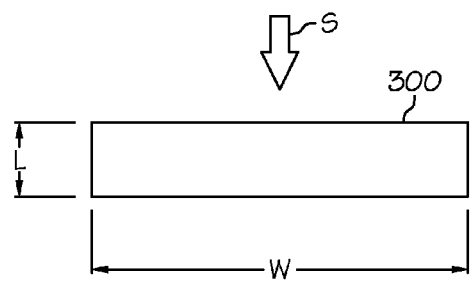
FIG. 3 is an exemplary laser beam area used in accordance with illustrative embodiments of the present invention.

FIG. 3 is an exemplary laser beam area used 300 in accordance with illustrative embodiments of the present invention. The beam area that is incident on the workpiece (e.g. such as structure 200) is approximately rectangular, having a width W and a length L. In some embodiments, the width W ranges from about 0.5 millimeters to about 300 millimeters and the length L ranges from about 250 micrometers to about 2.5 millimeters. In other embodiments, the width W ranges from about 500 micrometers to about 5 millimeters and the length L ranges from about 250 micrometers to about 2.5 millimeters. In other embodiments, the width W ranges from about 1.65 millimeters to about 1.75 millimeters and the length L ranges from about 290 micrometers to about 310 micrometers. In other embodiments, the length L ranges from about 80 micrometers to about 150 micrometers and the width W ranges from about 1 millimeter to about 1.5 millimeters.

In some embodiments, a single scan with the laser is performed, in which case each part of the BCP material (242 of FIG. 2) is only radiated once by the laser. In other embodiments, multiple scans of the laser are performed, where each portion of the BCP material is radiated by the laser multiple times. In some multiple-scan embodiments, the laser position is adjusted an incremental amount to achieve overlap between successive scans. In this case, the laser beam is moved slightly relative to the workpiece, such that only a portion of the BCP material radiated on the previous scan is radiated again on successive scans.

Figure 4A:
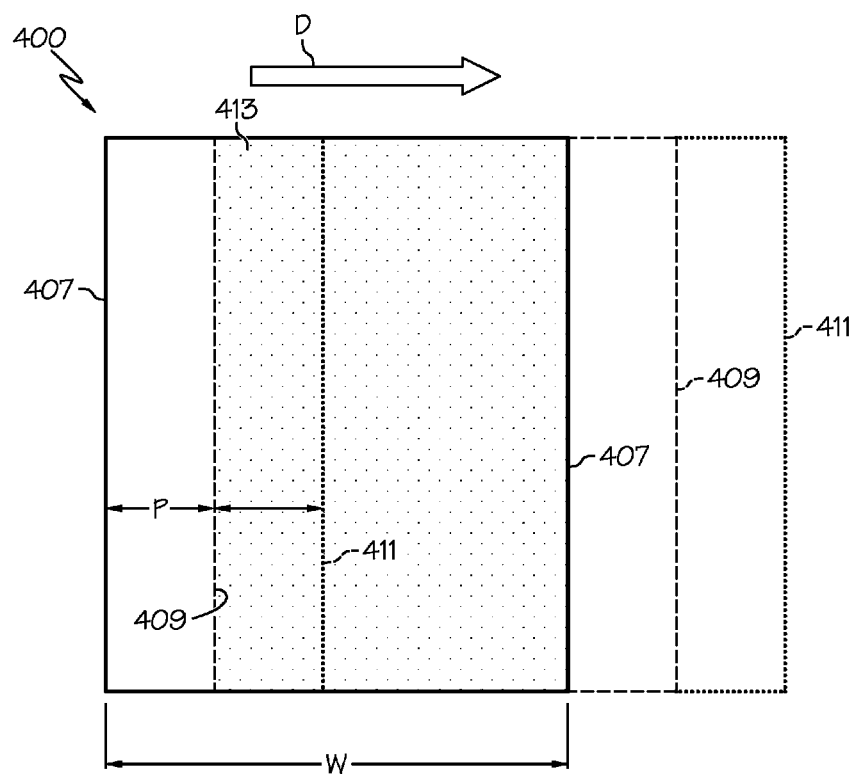
FIG. 4A is an exemplary laser beam multiple scan sequence with overlap used in accordance with illustrative embodiments of the present invention.

FIG. 4A is an exemplary laser beam multiple scan sequence 400 with overlap as used in accordance with illustrative embodiments of the present invention. Scan sequence 400 illustrates three scans of a laser. The first scan region is indicated by rectangle 407. The laser then moves a distance determined by the pitch P in the direction indicated by arrow D. The second scan region is indicated by rectangle 409 (dashed-line rectangle). The laser again moves a distance determined by the pitch P in the direction indicated by arrow D. The third scan region is indicated by rectangle 411 (dotted-line rectangle). In some embodiments, the pitch P is in the range of between 0.25 W to 0.35 W, where W is the length of the beam area. In other embodiments, the pitch P is in the range of between 0.4 W to 0.65 W. After the first two passes, the region 413 is the common area that is scanned on both the first scan (rectangle 407) and the second scan (rectangle 409). The multiple scan with overlap process may be used to cover a large area uniformly. It should be appreciated that the annealing process can be executed by moving the laser over a stationary workpiece, or by moving the workpiece through a stationary laser beam, or a combination thereof.

Various other tunable laser parameters may be adjusted to achieve an efficient setting for performing DSA on a BCP substrate. These parameters may include, but are not limited to, dwell time, intensity settings, power settings, scan type, and beam size parameters. Other parameters, which may or may not be tunable, include the wavelength of light used in the laser.

In some embodiments, the laser intensity (power per unit area, e.g. watts per square millimeter) is set to a range from 10 W/mm2 to 300 W/mm2. In other embodiments, the laser intensity is set to a range from 15 W/mm2 to 80 W/mm2. In other embodiments, the laser intensity is set to a range from 50 W/mm2 to 140 W/mm2. In other embodiments, the laser intensity is set to a range from 80 W/mm2 to 120 W/mm2. In other embodiments, the laser intensity is set to a range from 40 W/mm2 to 95 W/mm2. The laser intensity, in conjunction with the scanning speed and scan type (single, multiple scan, multiple scan with overlap), determine the temperature that the substrate reaches during the anneal that induces the DSA process. In some embodiments, the BCP material is heated to a temperature ranging from about 200 degrees Celsius to about 500 degrees Celsius. In other embodiments, the BCP material is heated to a temperature ranging from about 300 degrees Celsius to about 450 degrees Celsius. In other embodiments, the BCP material is heated to a temperature ranging from about 350 degrees Celsius to about 450 degrees Celsius. In one embodiment, the BCP material is heated to a temperature ranging from about 419 degrees Celsius to about 421 degrees Celsius.

In some embodiments, the wavelength of the laser is in the range of about 700 nanometers to about 1100 nanometers. In other embodiments, the wavelength of the laser is in the range of about 900 nanometers to about 1000 nanometers. In some embodiments, the wavelength of the laser is in the range of about 970 nanometers to about 990 nanometers. In one embodiment, the wavelength of the laser is 980 nanometers. In another embodiment, the wavelength of the laser is 10.6 micrometers. In addition to using a laser, some embodiments may employ other light sources such as bulbs, arc discharges, and flash lamps.

The dwell is another parameter that may be tuned to achieve a desired anneal. Dwell time, as used herein, corresponds to an amount of time that an intensity profile takes to move a full width at half maximum intensity across a point on the substrate surface. In some embodiments, the dwell time ranges from 200 microseconds to 200 milliseconds. In other embodiments, the dwell time ranges from 1 millisecond to 10 milliseconds. In other embodiments, the dwell time ranges from 10 milliseconds to 50 milliseconds.

Figure 4B:
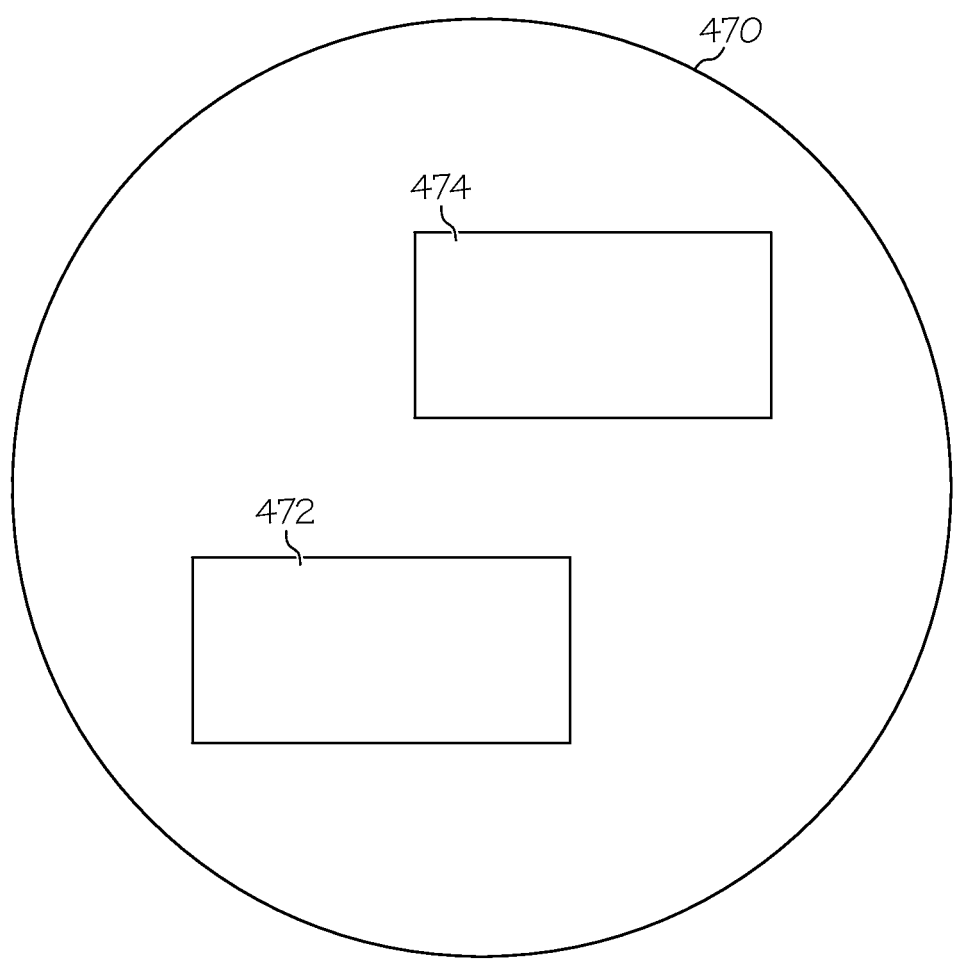
FIG. 4B illustrates multiple heating regions within a single wafer used in accordance with illustrative embodiments of the present invention.

FIG. 4B illustrates multiple heating regions within a single wafer 470. In some embodiments, the settings of dwell, laser intensity, and pitch may be changed during the course of scanning a single wafer. This provides the ability to have multiple heating conditions on a single wafer. For example, first heating region 472 of the wafer 470 may use a dwell time ranging from 500 microseconds to 700 microseconds, and second heating region 474 of the wafer 470 may use a dwell time ranging from 3 milliseconds to 20 milliseconds.

Figure 5C:
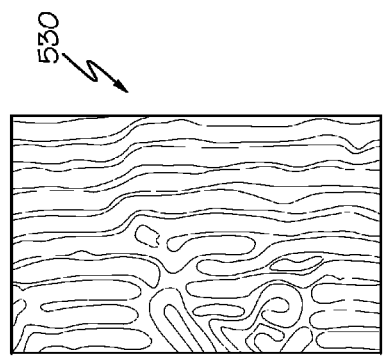
FIGS. 5A-5F show nanostructures at various stages of the annealing process in accordance with illustrative embodiments of the present invention.
Figure 5F:
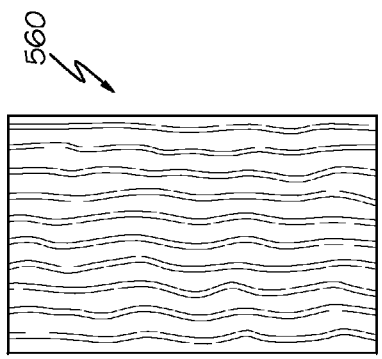
Figure 5B:
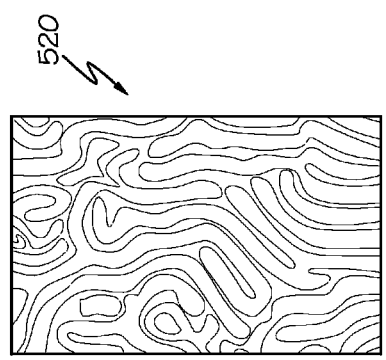
Figure 5E:
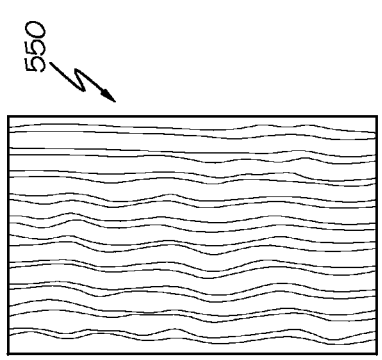
Figure 5A:
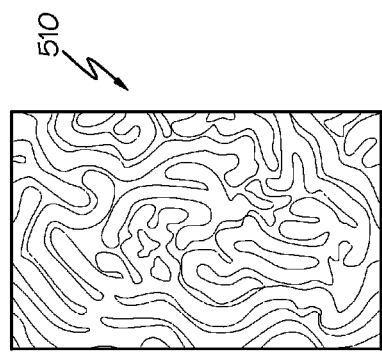
Figure 5D:
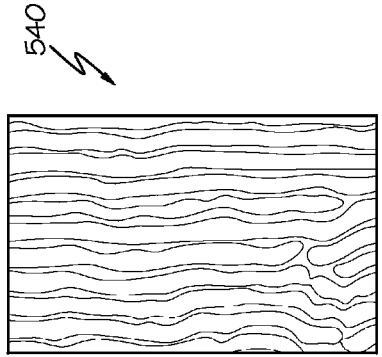

FIGS. 5A-5F show nanostructures as viewed "top-down" from the direction indicated by arrow Y in FIG. 2, at various stages of the annealing process in accordance with illustrative embodiments of the present invention. FIGS. 5A-5F show an illustrative embodiment with 36 scans per region in a multiple scan configuration. FIG. 5A shows a block copolymer region 510 after one scan with the laser (126 of FIG. 1). FIG. 5B shows a block copolymer region 520 after three scans with the laser (126 of FIG. 1). FIG. 5C shows a block copolymer region 530 after six scans with the laser (126 of FIG. 1). FIG. 5D shows a block copolymer region 540 after 12 scans with the laser (126 of FIG. 1). FIG. 5E shows a block copolymer region 550 after 24 scans with the laser (126 of FIG. 1). FIG. 5F shows a block copolymer region 560 after 36 scans with the laser (126 of FIG. 1). As can be seen in FIG. 5A, the structure of the block copolymer is unorganized after one pass. With each successive pass, the block copolymer becomes more organized, and begins to arrange as a series of vertical lines. By FIG. 5D, the lines are clearly visible, and by the final scan as shown in FIG. 5F, the lines are well-formed.

Figure 6:
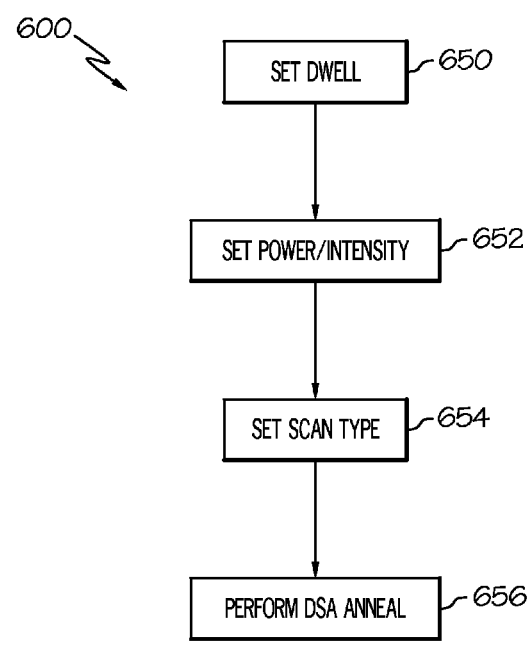
FIG. 6 is a flowchart indicating process steps in accordance with illustrative embodiments of the present invention.

FIG. 6 is a flowchart 600 indicating process steps in accordance with illustrative embodiments of the present invention. In process step 650, the dwell of the laser is set. In process step 652, the power (or intensity) of the laser is set. In process step 654, the scan type (single pass, multiple pass, or multiple pass with overlap) is set. If multiple pass with overlap is used, the pitch (see P of FIG. 5) is also selected. In process step 656, the laser radiation is applied to a BCP substrate to perform an anneal that induces directed self-assembly.

In various embodiments, design tools can be provided and configured to create the datasets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware module, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLAs), logical components, software routines, or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided approaches for performing directed self-assembly (DSA) of block copolymer (BCP) material on a substrate. The BCP is disposed over a patterned neutral layer which may be made from a random copolymer. The BCP is annealed with a laser to induce the directed self-assembly. The scan type may include single scan, multiple scan, or multiple scan with overlap. A variety of power (intensity) settings and dwell times may be used within a single wafer to achieve multiple heating conditions within a single wafer. Embodiments of the present invention may increase throughput over previously used methods of directed self-assembly.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for annealing a block copolymer comprising:
    forming a block copolymer layer on a patterned substrate;
    and directing laser radiation at the patterned substrate such that self-assembly of the block copolymer is induced;
    wherein the directing laser radiation comprises directing laser radiation with multiple overlapping scans, and wherein each scan of the multiple overlapping scans advances by a pitch distance that is a fraction of a laser beam area length, thereby forming a common area which receives multiple scans.

2. The method of claim 1, wherein directing radiation is performed with a pulsed laser.

3. The method of claim 1, wherein directing radiation is performed with a continuous wave laser.

4. The method of claim 3, wherein directing radiation is performed with a diode laser.

5. The method of claim 3, wherein directing radiation is performed with a $CO_2$ laser.

6. The method of claim 1, wherein directing radiation comprises directing radiation with a wavelength ranging from about 700 nanometers to about 1100 nanometers.

7. The method of claim 1, wherein directing radiation comprises directing radiation with a wavelength ranging from about 900 nanometers to about 1000 nanometers.

8. The method of claim 1, wherein directing radiation comprises directing radiation with a wavelength ranging from about 970 nanometers to about 990 nanometers.

9. The method of claim 1, wherein directing radiation comprises directing radiation with a dwell time ranging from 200 microseconds to 50 milliseconds.

10. The method of claim 1, wherein directing radiation comprises directing radiation with a dwell time ranging from 10 milliseconds to 100 milliseconds.

11. The method of claim 1, wherein directing radiation comprises directing radiation with a beam size having a length ranging from about 80 micrometers to about 150 micrometers and a width ranging from about 1 millimeter to about 1.5 millimeters.

12. The method of claim 1, wherein directing radiation comprises directing radiation with a beam size having a length ranging from about 290 micrometers to about 310 micrometers and a width ranging from about 1.65 millimeters to about 1.75 millimeters.

13. The method of claim 1, wherein directing radiation comprises heating the block copolymer to a temperature ranging from about 350 degrees Celsius to about 450 degrees Celsius.

14. The method of claim 1, further comprising setting a laser intensity setting for the laser to a power setting ranging from about 40 W/mm2 to about 95 W/mm2.

* * * * *